US005866846A

United States Patent [19]

Huag

[11] Patent Number: 5,866,846

[45] Date of Patent: Feb. 2, 1999

[54] SAFETY ELECTRICAL OUTLET

[76] Inventor: Shun-Feng Huag, No. 13, Lane 84, Na Fu Rd., Hsinchu City, Taiwan

[21] Appl. No.: 933,028

[22] Filed: Sep. 18, 1997

[51] Int. Cl.[6] ........................................ H05K 5/03

[52] U.S. Cl. ........................ 174/67; 220/242; 439/139; 439/143

[58] Field of Search ........................ 174/67; 220/242; 439/92, 139, 143

[56] References Cited

U.S. PATENT DOCUMENTS

| | | | |
|---|---|---|---|
| 2,515,003 | 7/1950 | Hamilton | 174/67 X |
| 2,515,870 | 7/1950 | Hamilton | 174/67 X |
| 2,752,581 | 6/1956 | Benander | 174/67 X |
| 4,717,350 | 1/1988 | Lax | 439/92 |

*Primary Examiner*—Dean A. Reichard
*Attorney, Agent, or Firm*—Varndell Legal Group

[57] ABSTRACT

A safety electrical outlet including a plurality of raised socket bodies with a respective pair of blade insertion slots for receiving metal contact blades of an electrical plug, a plurality of rotary safety socket covers respectively covered on the socket bodies and revolvably supported thereon, each rotary safety socket cover having two blade insertion slots for receiving metal contact blades of an electrical plug, and a plurality of spiral springs connected between the socket bodies and the rotary safety socket covers to hold the respective socket covers in a sealing position in which the blade insertion slots of the rotary safety socket covers are retained out of alignment with the blade insertion slots of the respective socket bodies.

5 Claims, 11 Drawing Sheets

SAFETY ELECTRICAL OUTLET

BACKGROUND AND SUMMARY OF THE INVENTION

The present invention relates to electrical outlets, and more particularly to a safety electrical outlet which automatically seals off its blade insertion slots upon removable of an electrical plug.

When an extension cable is used, it may disorderly put on the floor, Because the blade insertion slots of the socket bodies of the electrical outlets of conventional extension cables are constantly exposed to the outside for receiving electrical plugs, water may pass to the inside to wet the electrical circuit, causing a short circuit. Furthermore, children may insert pointed metal object into the blade insertion slots, causing an electric shock.

The present invention has been accomplished to provide a safety electrical outlet which eliminates the aforesaid problems. According to one aspect of the present invention, the safety electrical outlet comprises a rotary safety socket cover revolvably covered on each socket body thereof, and a spiral spring connected between each rotary safety socket cover and the corresponding socket body to hold the respective rotary safety socket cover in a sealing position in which the blade insertion slots of the corresponding socket body in sealed. According to another aspect of the present invention, the rotary safety socket cover has a recessed portion or raised portion through which the rotary safety socket cover can be positively turned relative to the corresponding socket body with one finger. According to still another aspect of the present invention, a fuseless switch is installed in the electrical wire of the safety electrical outlet which automatically trips off upon an overcurrent.

DETAILED DESCRIPTION OF THE PREFERRED EMBODIMENT

Figure 1:
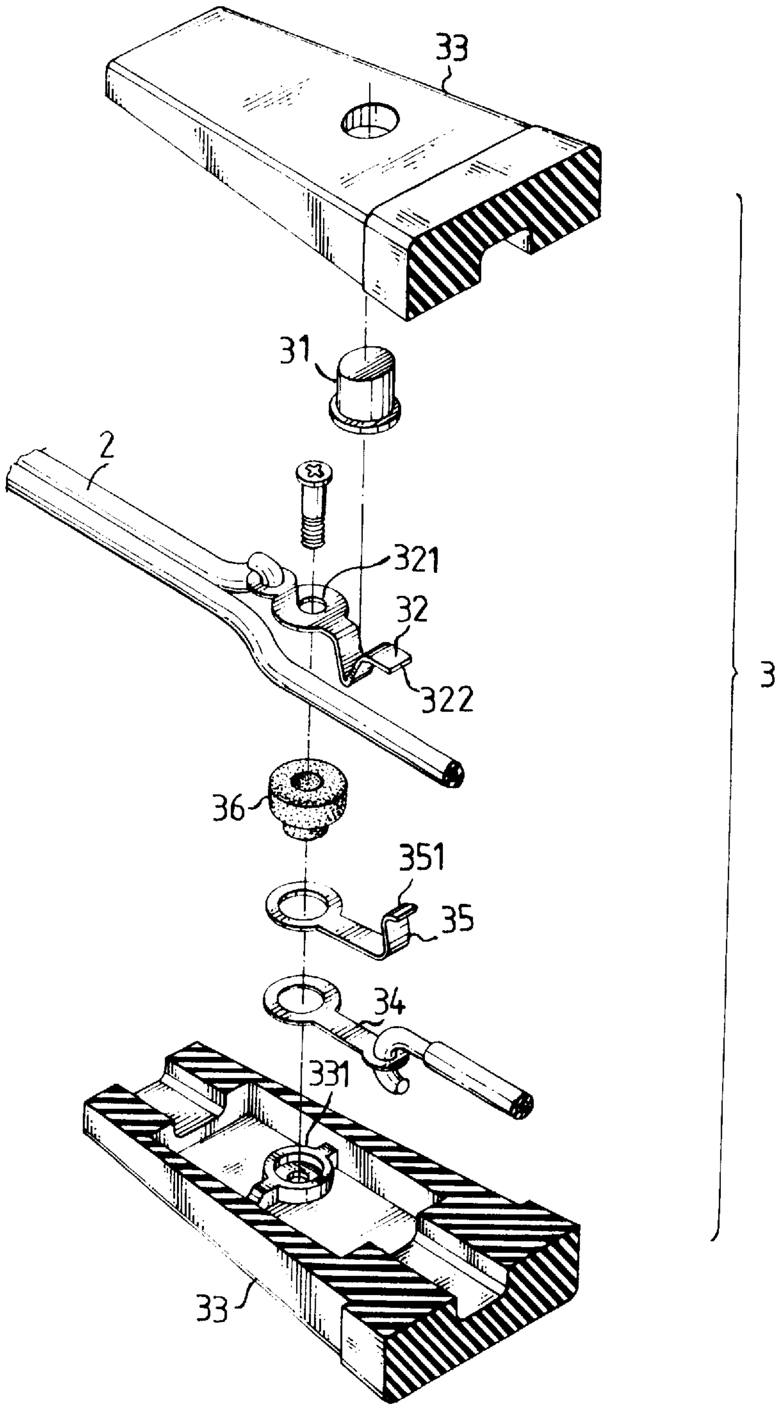
FIG. 1 is an exploded view of a fuseless switch according to the present invention.

Referring to FIGS. 4, 5, 8 and 9, a safety electrical outlet 1 according to one embodiment of the present invention comprises a plurality of raised socket bodies 142, a plurality of rotary safety socket covers 11 respectively covered on the socket bodies 142, and a plurality of spiral springs 12 connected between the socket bodies 142 and the rotary safety socket covers 11 to hold the respective socket bodies 142 in a sealing position. Each raised socket body 142 comprises an annular mounting groove 141 around the periphery, a center recessed hole 143, and two blade insertion slots 14 equally spaced from the center recessed hole 143 at two opposite sides for receiving two metal contact blades of an electrical plug. A packing block 13 is tightly fitted into the center recessed hole 143 of each socket body 142, having a locating groove 131. Each rotary safety socket cover 11 comprises an inward coupling flange 111 raised from its inside wall and coupled to the annular mounting groove 141 of the corresponding socket body 142, a downward stub rod 112 at the center corresponding to the center recessed hole 143 of the corresponding socket body 142, a locating hole 113 at the downward stub rod 112, and two blade insertion slots 115 adapted for receiving two metal contact blades of an electrical plug. Each spiral spring 12 has a first end 121 fastened to the locating groove 131 of the packing block 13 in the recessed center hole 143 of the corresponding socket body 142, and a second end 122 fastened to the locating hole 113 of the downward stub rod 112 of the corresponding rotary safety socket cover 11. The spiral springs 12 impart a pressure to the respective rotary safety socket covers 11, causing the respective rotary safety socket covers 11 to be respectively retained in a sealing position with the respective blade insertion slots 115 retained out of alignment with the blade insertion slots 14 of the respective socket bodies 142. Therefore, the blade insertion slots 14 of the socket bodies 142 are normally sealed by the respective rotary safety socket covers 11. When in use, the selected rotary safety socket cover 11 is turned to the operative position in which the blade insertion slots 115 of the respective rotary safety socket cover 11 are retained in alignment with the blade insertion slots 14 of the corresponding socket body 142 for permitting two metal contact blades of an electrical plug to be installed in the selected socket body 142 to make an electrical contact.

Figure 6:
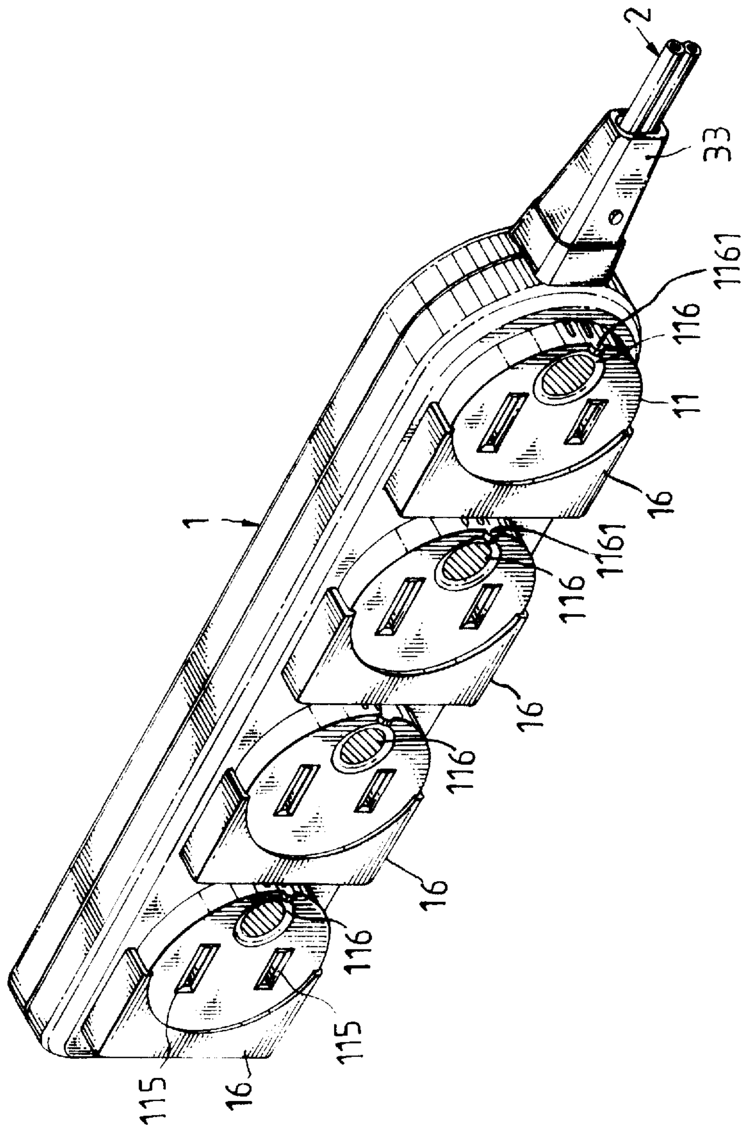
FIG. 6 is an elevational view of an alternate form of the safety electrical outlet according to the present invention.
Figure 7:
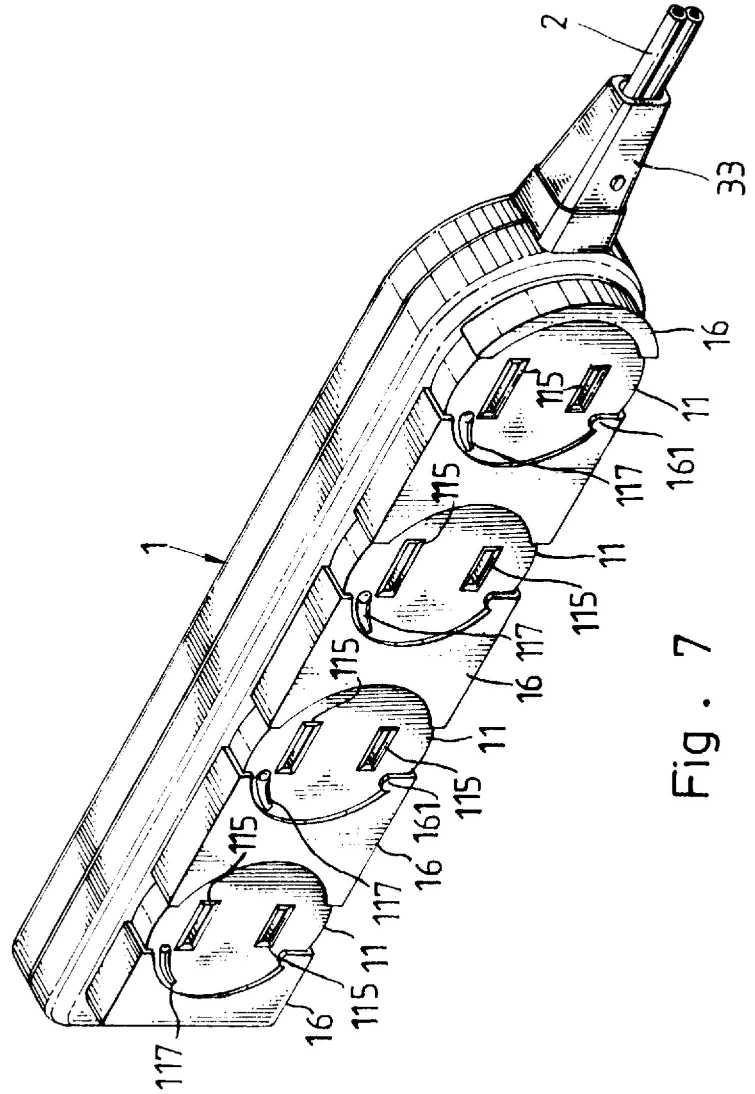
FIG. 7 is an elevational view of another alternate form of the safety electrical outlet according to the present invention.
Figure 8:
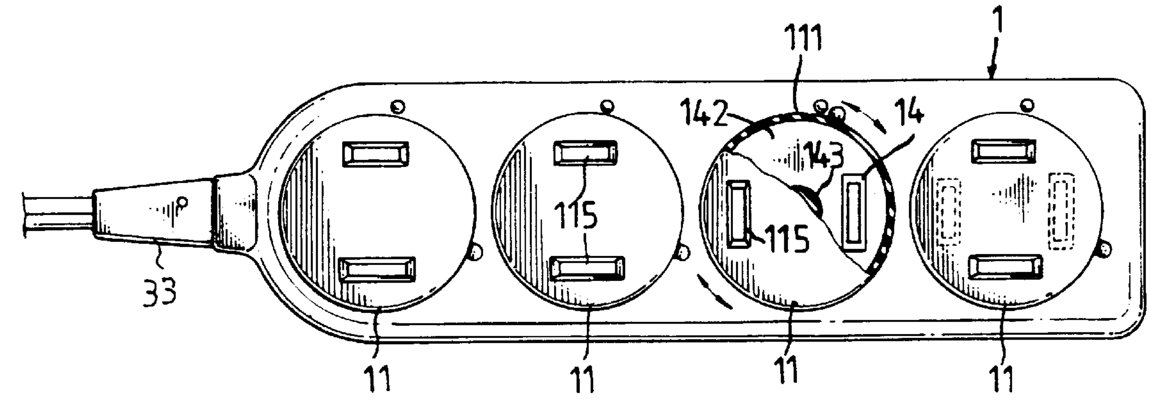
FIG. 8 is a top plain view of the safety electrical outlet shown in FIG. 5.
Figure 9:
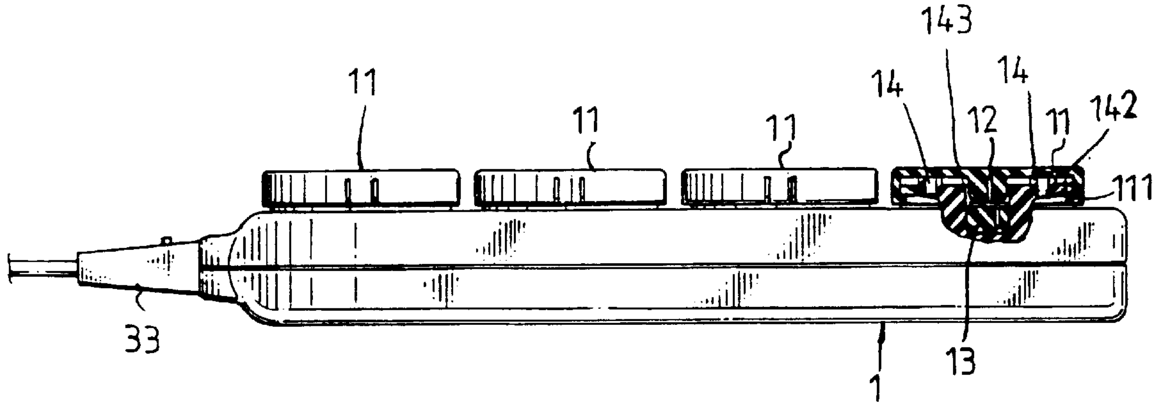
FIG. 9 is a sectional side view of the safety electrical outlet shown in FIG. 5.
Figure 10:
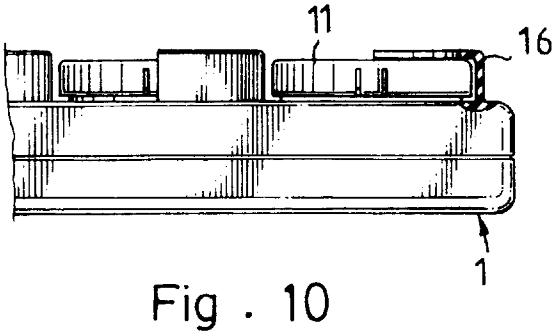
FIG. 10 is a sectional side view of a part of FIG. 6.
Figure 11:
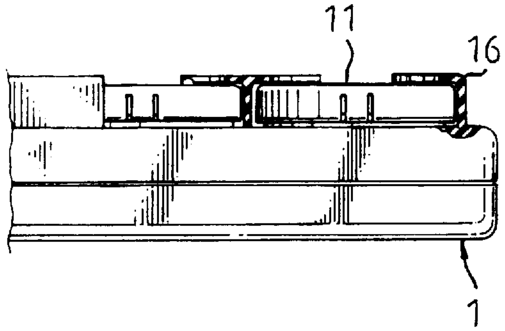
FIG. 11 is a sectional side view of a part of FIG. 7.
Figure 13:
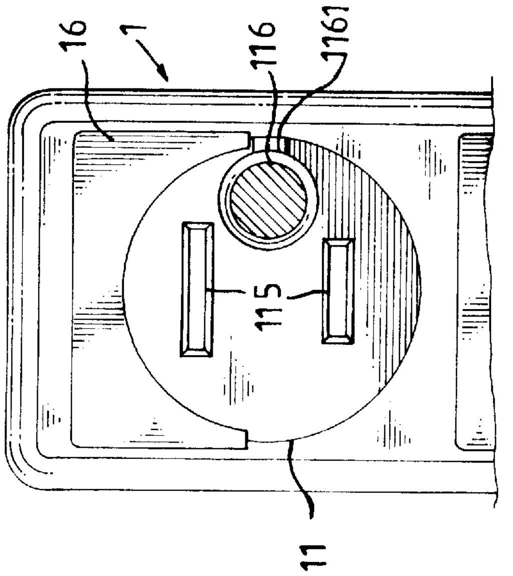
FIG. 13 is similar to FIG. 12 but showing the rotary safety socket cover retained in the sealing position.
Figure 12:
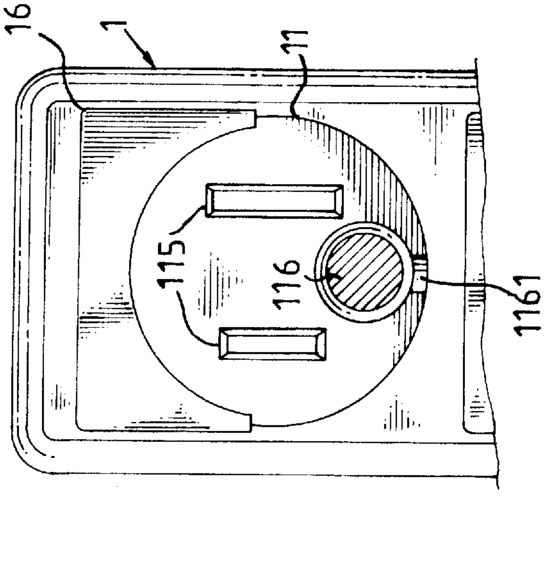
FIG. 12 is a top view in an enlarged scale of a part of FIG. 6.
Figure 15:
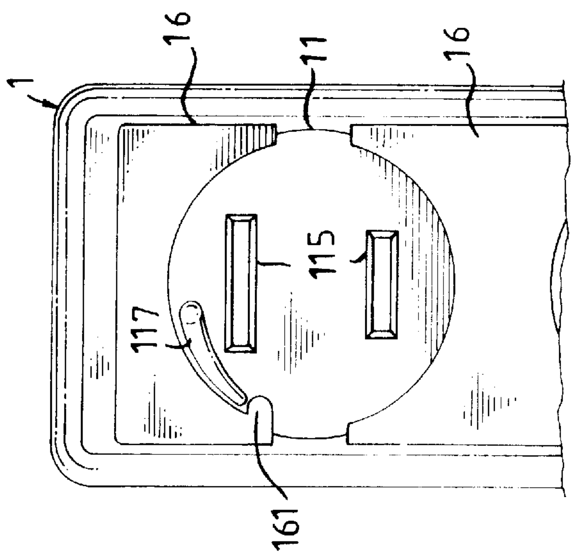
FIG. 15 is similar to FIG. 14 but showing the rotary safety socket cover retained in the sealing position.
Figure 14:
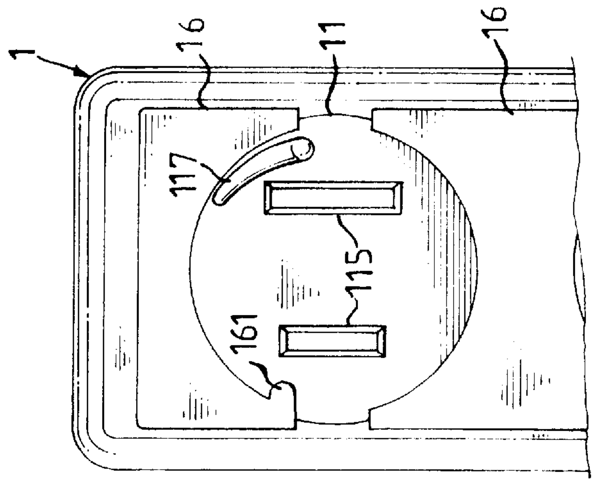
FIG. 14 is a top view in an enlarged scale of a part of FIG. 7.

Referring to FIGS. 6 and 7 and FIGS. from 10 to 15, a recessed portion 116 (see FIG. 6) or raised portion 117 (see FIG. 7) may be made on each rotary safety socket cover 11 through which the respective rotary safety socket cover 11 can be positively turned with a finger. Guard flanges 16 are made on the safety electrical outlet 1 to protect the rotary safety socket covers 11 against kicking. Each rotary safety socket cover 11 which has a recessed portion 116 made thereon for turning with a finger has a rib 1161 adjacent its recessed portion 116. The rib 1161 is stopped at one guard flange 16 to hold the respective rotary safety socket cover 11 in the sealing position (see FIG. 13). FIG. 12 shows the rotary safety socket cover 11 turned to the operative position in which the rib 1161 is moved away from the corresponding guard flange 16. The guard flange 16 may be made having a projecting portion 161 adapted for stopping against the raised portion 117 of the corresponding rotary safety socket cover 1, which has a raised portion 117 made thereon for turning with a finger, when the corresponding rotary safety socket cover 11 is turned to the operative position (see FIG. 15). When the rotary safety socket cover 11 is released from the hand, it is returned to its former sealing position (see FIG. 14).

Figure 2:
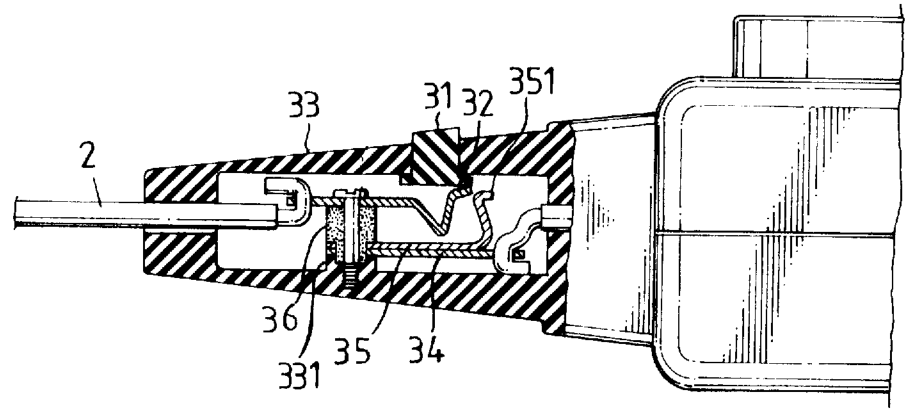
FIG. 2 is a sectional view of the fuseless switch according to the present invention, when tripped off.
Figure 3:
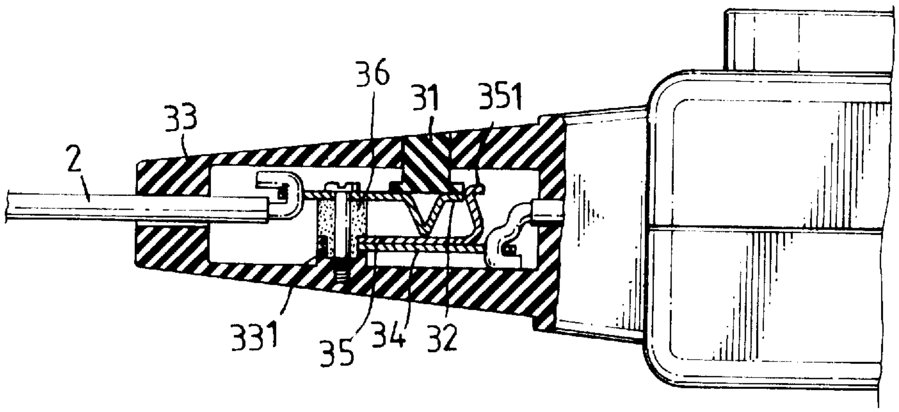
FIG. 3 is a sectional view of the fuseless switch according to the present invention when electrically connected.
Figure 4:
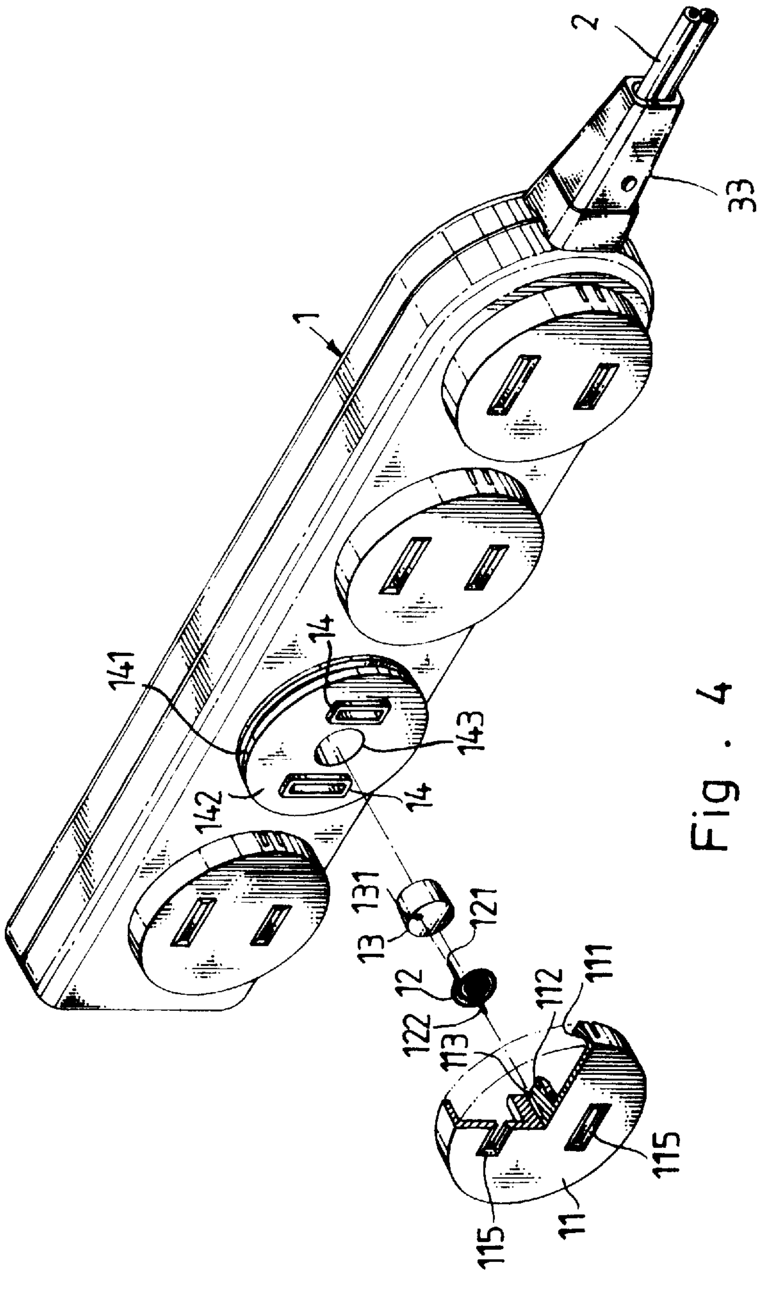
FIG. 4 is an exploded view of a safety electrical outlet according to the present invention.
Figure 5:
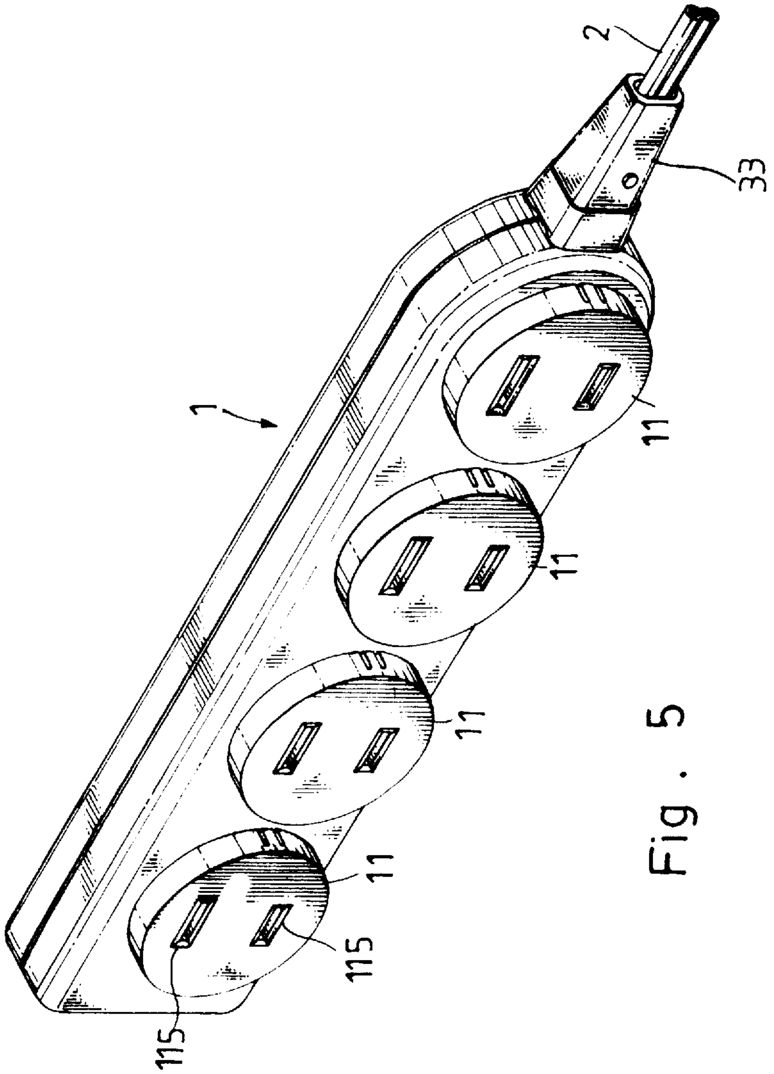
FIG. 5 an elevational view of the safety electrical outlet shown in FIG. 4.
Figure 16:
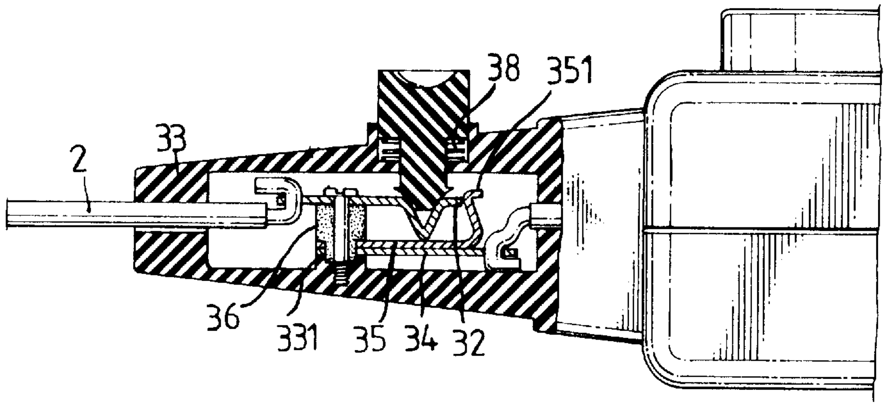
FIG. 16 is a sectional view of an alterante form of the fuseless switch according to the present invention.

Referring to FIGS. 1, 2 and 3, and FIG. 6 again, a fuseless switch 3 is fastened to an electrical wire 2 at one end of the electrical outlet 1. The electrical wire 2 is adapted for connecting the electrical outlet 1 to electrical power supply, having a hot line and a neutral line respectively connected to positive terminal and negative terminal of electric power supply. The fuseless switch 3 comprises an electrically insulative casing 33 fastened to one end of the electrical outlet 1 and covered around the electrical wire 2, and an auto-switching mechanism connected between two separated sections of the hot line of the electrical wire 2 which automatically trips off the circuit upon an overcurrent. The auto-switching mechanism comprises a first terminal 34 connected to one section of the hot line of the electrical wire 2 and fastened to a seat 331 inside the electrically insulative casing 33, a metal contact plate 35 fastened to the seat 331 and connected to the first terminal 34 and having an upwardly curved contact tip 351, an electrically insulative locating block 36 fastened to the seat 331 to hold down the metal contact plate 35 and the first terminal 34, a second terminal 32 having a fixed end fixedly and electrically connected to a second section of the hot line of the electrical wire 2 and a mounting hole 321 adjacent its fixed end fastened to a top side of the electrically insulative locating block 36 and spaced from the metal contact, plate 35 and a curved contact tip 322 at its free end disposed in contact with the curved contact tip 351 of the metal contact plate 35, and a press button 31 supported on the free end of the second terminal 32 and partially projecting out of a hole 332 on the casing 33. When an overcurrent passes through the electrical wire 2, the free end of the second terminal 32 is heated to deform, causing the contact tip 322 of the second terminal 32 to trip off and to disconnect from the contact tip 351 of the metal contact plate 35, and therefore the electrical wire 2 is electrically disconnected. When the overcurrent problem is eliminated, the press button 31 is depressed to force the contact tip 322 of the second terminal 32 into contact with the contact tip 351 of the metal contact plate 35 again, and therefore the two sections of the hot line of the electrical wire 2 are electrically connected again by the first terminal 32, the metal contact plate 35 and the second terminal 34. Furthermore, a spring 38 may be mounted on the casing 33 to support the press button 31 (see FIG. 16).

I claim:

1. A safety electrical outlet comprising a plurality of raised socket bodies and an electrical wire adapted for connecting city power supply to said socket bodies, wherein a plurality of rotary safety socket covers are respectively covered on said socket bodies, and a plurality of spiral springs are connected between said socket bodies and said rotary safety socket covers to hold said respective socket covers in a sealing position, each of said socket bodies comprising an annular mounting groove around a periphery there of, a center recessed hole, two blade insertion slots equally spaced from said center recessed hole at two opposite sides for receiving two metal contact blades of an electrical plug, and a packing block tightly fitted into said center recessed hole, said packing block having a locating groove, each of said rotary safety socket covers comprising an inward coupling flange raised from an inside wall and coupled to the annular mounting groove of the corresponding socket body, a downward stub rod at the center corresponding to the center recessed hole of the corresponding socket body, a locating hole in said downward stub rod, and two blade insertion slots adapted for receiving two metal contact blades of an electrical plug, each of said spiral springs having a first end fastened to the locating groove of the packing block in the center recessed hole of the corresponding socket body and a second end fastened to the locating hole of the downward stub rod of the corresponding rotary safety socket cover, said spiral springs imparting a pressure to the respective rotary safety socket covers, causing the respective rotary safety socket covers to be respectively retained in a sealing position with their respective blade insertion slots retained out of alignment with the blade insertion slots of the respective socket bodies.

2. The safety electrical outlet of claim 1, wherein a plurality of guard flanges are disposed around said socket bodies for protecting said rotary safety socket covers without stopping said rotary safety socket covers from a rotary motion relative to said socket bodies.

3. The safety electrical outlet of claim 2, wherein each of said rotary safety socket covers comprises a recessed portion through which the respective rotary safety socket cover can be turned with one finger to move the blade insertion slots of the respective rotary safety socket into alignment with the blade insertion slots of the corresponding socket body, and a peripheral rib which is stopped at an edge of one of said guard flanges when the respective rotary safety socket cover is retained in the sealing position.

4. The safety electrical outlet of claim 2, wherein each of said rotary safety socket covers comprises a raised portion through which the respective rotary safety socket cover can be turned with one finger to move the blade insertion slots of the respective rotary safety socket into alignment with the blade insertion slots of the corresponding socket body, said raised portion being stopped at a projection portion of one of said guard flanges when respective rotary safety socket cover is retained in the sealing position.

5. The safety electrical outlet of claim 1 further comprising a fuseless switch connected to said electrical wire to automatically cut off the electric current flow through said electrical wire upon an overcurrent, said fuseless switch comprising an electrically insulative casing fastened to one end of the safety electrical outlet and covered around said electrical wire, an auto-switching mechanism connected to one line of said electrical wire to automatically switch off the electric current flow upon an overcurrent, and a press button adapted to force said auto-switching mechanism to switch on the electric current flow after an overcurrent.

* * * * *